(12) United States Patent
George et al.

(10) Patent No.: US 10,481,194 B2
(45) Date of Patent: Nov. 19, 2019

(54) AUTOMATED HIGH FREQUENCY TEST STATION

(71) Applicant: COMMSCOPE CONNECTIVITY UK LIMITED, Swindon, Wiltshire (GB)

(72) Inventors: Ian Robert George, Churchdown (GB); Bernard Harold Hammond, Jr., Cheltenham (GB); Jacob Meachen, Gloucester (GB); Gordon John White, Gloucester (GB)

(73) Assignee: CommScope Connectivity UK Limited (GB)

( * ) Notice: Subject to any disclaimer, the term of this patent is extended or adjusted under 35 U.S.C. 154(b) by 501 days.

(21) Appl. No.: 15/026,693

(22) PCT Filed: Oct. 2, 2014

(86) PCT No.: PCT/EP2014/071148
§ 371 (c)(1),
(2) Date: Apr. 1, 2016

(87) PCT Pub. No.: WO2015/049333
PCT Pub. Date: Apr. 9, 2015

(65) Prior Publication Data
US 2016/0252561 A1 Sep. 1, 2016

Related U.S. Application Data

(60) Provisional application No. 61/885,879, filed on Oct. 2, 2013.

(51) Int. Cl.
| | | |
|---|---|---|
| *G01R 31/04* | (2006.01) | |
| *G01R 1/04* | (2006.01) | |
| *G01R 31/28* | (2006.01) | |

(52) U.S. Cl.
CPC ......... *G01R 31/045* (2013.01); *G01R 1/0408* (2013.01); *G01R 31/2822* (2013.01);
(Continued)

(58) Field of Classification Search
CPC .... G01R 1/0408; G01R 1/0416; G01R 31/04; G01R 31/043; G01R 31/045;
(Continued)

(56) References Cited

U.S. PATENT DOCUMENTS

| | | | |
|---|---|---|---|
| 3,678,379 A | 7/1972 | Arvay et al. | |
| 4,936,011 A * | 6/1990 | Berry | H01R 43/20 |
| | | | 29/748 |

(Continued)

FOREIGN PATENT DOCUMENTS

AU      2012 265 604      1/2013

OTHER PUBLICATIONS

International Search Report and Written Opinion for International Application No. PCT/EP2014/071148 dated Mar. 5, 2015 (20 pages).

(Continued)

*Primary Examiner* — Huy Q Phan
*Assistant Examiner* — David B Frederiksen
(74) *Attorney, Agent, or Firm* — Merchant & Gould P.C.

(57) ABSTRACT

A test station and method of testing a design under test are disclosed. One method includes applying a first test frequency signal to a reference path to determine a first known attenuation level, and applying the first test frequency signal to a design under test to determine a first tested attenuation level of the design under test at the first test frequency. The method also includes applying a second test frequency signal to the reference path to determine a second known attenuation level, and applying the second test frequency signal to the design under test to determine a second tested (Continued)

attenuation level of the design under test at the second test frequency. The method includes determining whether the design under test is faulty based on the first tested attenuation level and the second tested attenuation level.

16 Claims, 6 Drawing Sheets

(52) U.S. Cl.
CPC ...... *G01R 31/2834* (2013.01); *G01R 31/2805* (2013.01); *G01R 31/2808* (2013.01)

(58) Field of Classification Search
CPC .............. G01R 31/282; G01R 31/2822; G01R 31/2832; G01R 31/2834
See application file for complete search history.

(56) References Cited

U.S. PATENT DOCUMENTS

| | | | | |
|---|---|---|---|---|
| 5,097,213 | A * | 3/1992 | Hunting | G01R 31/043 |
| | | | | 324/519 |
| 5,177,555 | A * | 1/1993 | Stratton | G01L 5/0057 |
| | | | | 250/227.19 |
| 5,247,277 | A | 8/1993 | Kefalas | |
| 5,821,760 | A * | 10/1998 | Koeman | H04B 3/46 |
| | | | | 324/628 |
| 6,725,404 | B1 * | 4/2004 | Choudhury | G01R 31/045 |
| | | | | 714/715 |
| 8,138,778 | B1 * | 3/2012 | Smith | G01R 31/2822 |
| | | | | 324/756.02 |
| 2002/0137032 | A1 * | 9/2002 | Hefti | C12Q 1/001 |
| | | | | 435/6.11 |
| 2004/0140813 | A1 | 7/2004 | Bolouri-Saransar et al. | |
| 2006/0082377 | A1 | 4/2006 | Bolouri-Saransar et al. | |
| 2008/0042666 | A1 * | 2/2008 | Sullivan | G01R 1/06766 |
| | | | | 324/754.03 |
| 2009/0066350 | A1 * | 3/2009 | Lee | G01R 31/2889 |
| | | | | 324/754.07 |
| 2010/0227574 | A1 * | 9/2010 | Kuenen | G01R 31/2884 |
| | | | | 455/115.2 |
| 2013/0021048 | A1 * | 1/2013 | Peng | G01R 31/2822 |
| | | | | 324/750.3 |
| 2013/0090077 | A1 * | 4/2013 | Rozenblit | H04W 52/52 |
| | | | | 455/127.2 |
| 2013/0162050 | A1 * | 6/2013 | Chang | H01R 13/6683 |
| | | | | 307/86 |
| 2013/0257448 | A1 * | 10/2013 | Tu | G06F 11/24 |
| | | | | 324/538 |

OTHER PUBLICATIONS

Guarna. "Qualified Partner Programme QPP" retrieved from http://www.netplex.gr/pdf/structured/02/rj45_connectors_theory.pdf Aug. 11, 2003 pp. 16-30; 46-52.

Unknown. "TIA/EIA Standard Commercial Building Telecommunications Cabling Standard Part 2: Balanced Twisted-Pair Cabling Components TIA/EIA-568-B.2" retrieved at http://www.csd.uoc.gr/hy435/material/TIA-EIA-568-B.2.pdf. May 2001 pp. 1-160.

* cited by examiner

AUTOMATED HIGH FREQUENCY TEST STATION

CROSS-REFERENCE TO RELATED APPLICATIONS

This application is a National Stage of PCT/EP2014/071148, filed 2 Oct. 2014, which claims benefit of U.S. Patent Application Ser. No. 61/885,879 filed on Oct. 2, 2013, and which applications are incorporated herein by reference. To the extent appropriate, a claim of priority is made to each of the above disclosed applications.

TECHNICAL FIELD

The present application relates generally to testing of electrical characteristics of high-frequency telecommunications components. In particular, the present application relates to an automated high-frequency test station.

BACKGROUND

Telecommunication cabling systems, when implemented using electrical signals, utilize twisted pair wiring and electrical connectors to form communication channels between computing systems, routers, or other telecommunications and networking equipment. The wiring, formed as cables, as well as the electrical connectors, are required to meet electrical performance criteria set by such ISO standards.

For example, international standard ISO/IEC 11801 specifies general-purpose telecommunication cabling systems (structured cabling) that are suitable for a wide range of applications (analog and ISDN telephony, various data communication standards, building control systems, factory automation). The ISO/IEC standard covers both balanced copper cabling and optical cabling. The standard defines several classes, or categories, of twisted-pair copper interconnects, which differ in the maximum frequency for which a certain channel performance is required. For example, category 5c utilizes frequencies up to 100 MHz, while category 6 utilizes frequencies up to 250 MHz. Category 6a utilizes frequencies up to 500 MHz, and category 7 uses frequencies of up to 1 GHz.

When telecommunications equipment, including telecommunications connectors, are manufactured, they are therefore typically tested to ensure compliance with electrical performance characteristics. For example, when manufactured, the RF performance of RJ-45 modular jacks used in telecommunications networks is tested to determine compliance with such standards.

Due to the nature of RJ-45 modular plugs, there is a split pair (i.e., the "3-6 pair") that has poor crosstalk performance. In order for the modular jack to achieve the requirements of category 5e and higher, such jacks require compensation to cancel some of the crosstalk of the modular plug. To achieve the requirements for category 6 and higher, the compensation within the jack has to be maintained within a very narrow performance band. This compensation is often contained in both the contact set of the modular jack as well as capacitive and inductive coupling on a circuit board. The majority of the compensation for the near-end crosstalk (NEXT) is capacitive and is usually included on a printed circuit board.

Due to the materials and manufacturing processes for inexpensive printed circuit boards, there is a significant amount of variability in the compensating capacitance between manufactured parts. These variations can shift the performance of an RJ-45 jack outside of the accepted performance range. In order to ensure quality product, production samples are often tested at the manufacturing site. These tests are time consuming and complicated to perform, requiring use of specialized test fixtures and a network analyzer. Furthermore, because such tests are performed after a finished product has been created, disassembly and fixing of any performance issues lead to inefficiencies. Finally, because of the difficulty involved in testing such RJ-45 jacks, performance testing is currently performed on a sampled basis, rather than testing every manufactured jack.

SUMMARY

In accordance with the following disclosure, the above and other issues are addressed by the following:

In a first aspect, a test station is disclosed. The test station includes a test platform including a plurality of probes configured for electrical connection to a design under test. The test station also includes a radio frequency switch configured to receive at least first and second signals at first and second frequencies, the first and second frequencies being different from each other. The test station further includes an amplifier positioned and electrically connected to one or more of the plurality of probes, the amplifier configured to receive the selected signal from the radio frequency switch and output a test signal, the test signal corresponding to an amplified selected signal, and a second amplifier positioned and electrically connected to one or more of the plurality of probes, the second amplifier configured to receive a result signal passed through the design under test. The test station also includes a power sensor electrically connected to receive a scaled result signal based on the result signal and generate a sensed power output signal. The test station includes a control circuit communicatively connected to the radio frequency switch, amplifier, second amplifier, and power sensor, the control circuit configured to execute instructions to selectively apply the first and second frequencies as the test signal to the one or more of the plurality of probes, thereby applying a test signal at each of the first and second frequencies to the design under test, the control circuit further configured to determine the existence of a faulty design under test based on the sensed power output signal.

In a second aspect, a method of testing performance of a design under test is disclosed. The method includes applying a first test frequency signal to a reference path to determine a first known attenuation level, and applying the first test frequency signal to a design under test to determine a first tested attenuation level of the design under test at the first test frequency. The method also includes applying a second test frequency signal to the reference path to determine a second known attenuation level, and applying the second test frequency signal to the design under test to determine a second tested attenuation level of the design under test at the second test frequency. The method includes determining whether the design under test is faulty based on the first tested attenuation level and the second tested attenuation level.

In a third aspect, a method of testing performance of an RJ-45 connector includes testing an RJ-45 jack to determine a near-end crosstalk of the RJ-45 jack, modifying a compensation circuit of the RJ-45 jack to tune a near-end crosstalk such that it at least approaches a maximum near-end crosstalk, and disassembling the RJ-45 jack to arrive at a jack subassembly including the modified compensation circuit. The method further includes testing the jack subassembly to determine a near-end crosstalk of the jack subassembly including the modified compensation circuit to determine a maximum near-end crosstalk acceptable for a jack subassembly under test. The method also includes modifying a second compensation circuit of a second RJ-45 jack to tune a near-end crosstalk such that it at least approaches a minimum near-end crosstalk, disassembling the second RJ-45 jack to arrive at a second jack subassembly including the second modified compensation circuit, and testing the second jack subassembly to determine a near-end crosstalk of the second jack subassembly including the second modified compensation circuit to determine a minimum near-end crosstalk acceptable for the jack subassembly under test.

DETAILED DESCRIPTION

Figure 1:
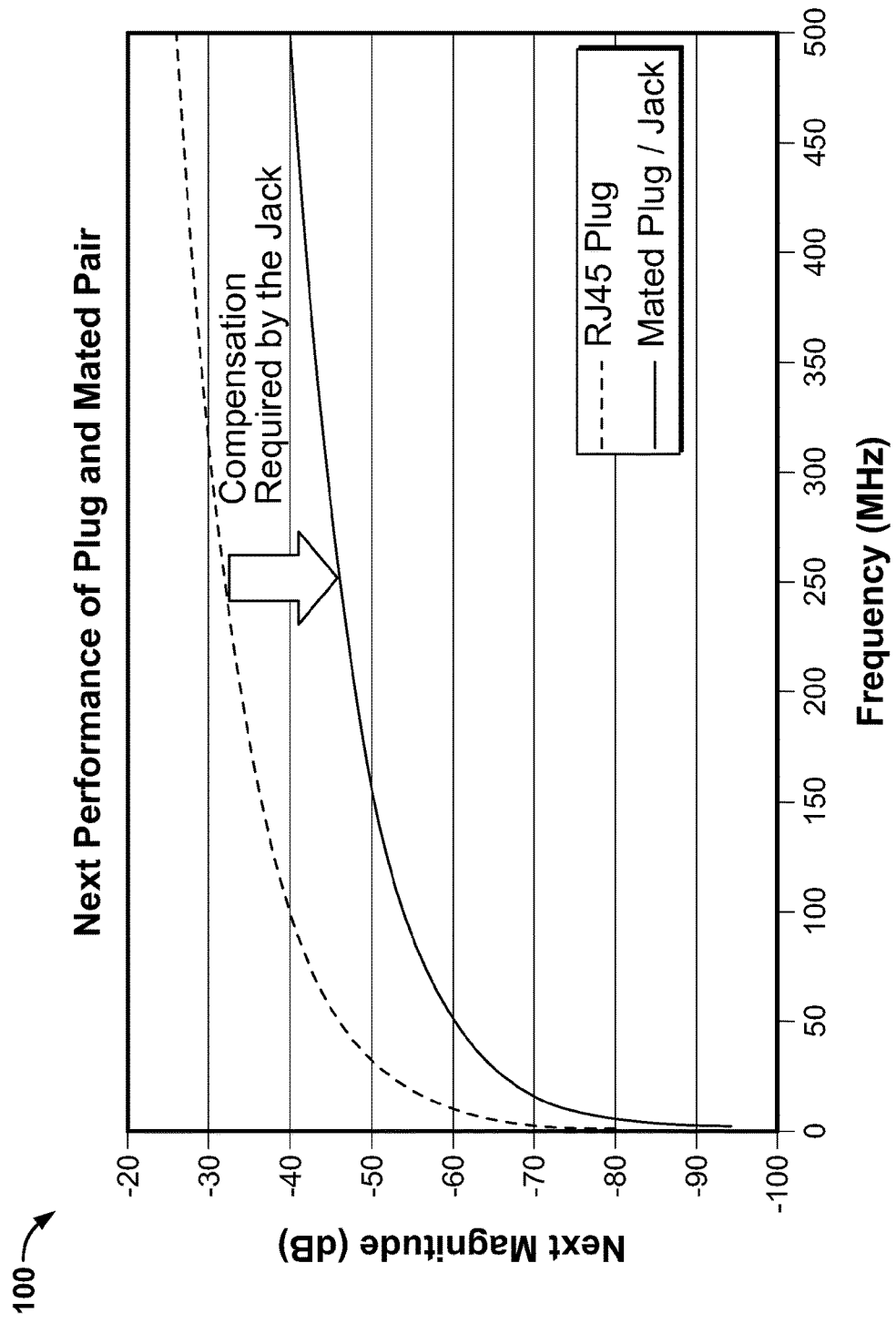
FIG. 1 illustrates near end crosstalk performance of an RJ-45 plug and mated plug and jack, illustrating an example effect of crosstalk compensation applied in an RJ-45 jack.

Various embodiments of the present invention will be described in detail with reference to the drawings, wherein like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

In general the present disclosure relates to an automatic high-frequency test station useable to test twisted pair connectors, such as RJ-45 jacks. The test station discussed herein is configurable to test communication and electrical performance of such connectors at a variety of different frequencies, including frequencies up to an exceeding 1 GHz, thereby meeting current and future telecommunications standards. The test station discussed herein allows for a number of advantages over previous testing systems. For example, the automated test station allows for automatic testing of every telecommunications connector in a particular manufactured batch at any of a configurable sets of frequencies, and also allows for testing of at least a subassembly portion of each manufactured telecommunications connector, rather than requiring that testing only be performed on a sampled subset of such connectors. Use of the test station avoids the costly and complex process of developing special test fixtures, and use of a circuit analyzer, by enabling crosstalk measurements of the jack circuit parameters during manufacture and to predict the Near End Crosstalk (NEXT) performance of the finished jack relative to predefined performance standards.

Referring to FIG. 1 generally, a chart 100 illustrating an effect of crosstalk compensation applied at a circuit to near end crosstalk at an RJ-45 jack. As seen in the chart 100, application of crosstalk compensation to an RJ-45 jack results in a lowered overall near end crosstalk at a mated plug-jack combination. Overall, the magnitude of NEXT should be lowered below acceptable levels. As noted above, manufacturing variances may cause NEXT to remain at an unacceptable level at one or more frequencies. Accordingly, testing of such manufactured RJ-45 jacks is desired.

Figure 2:
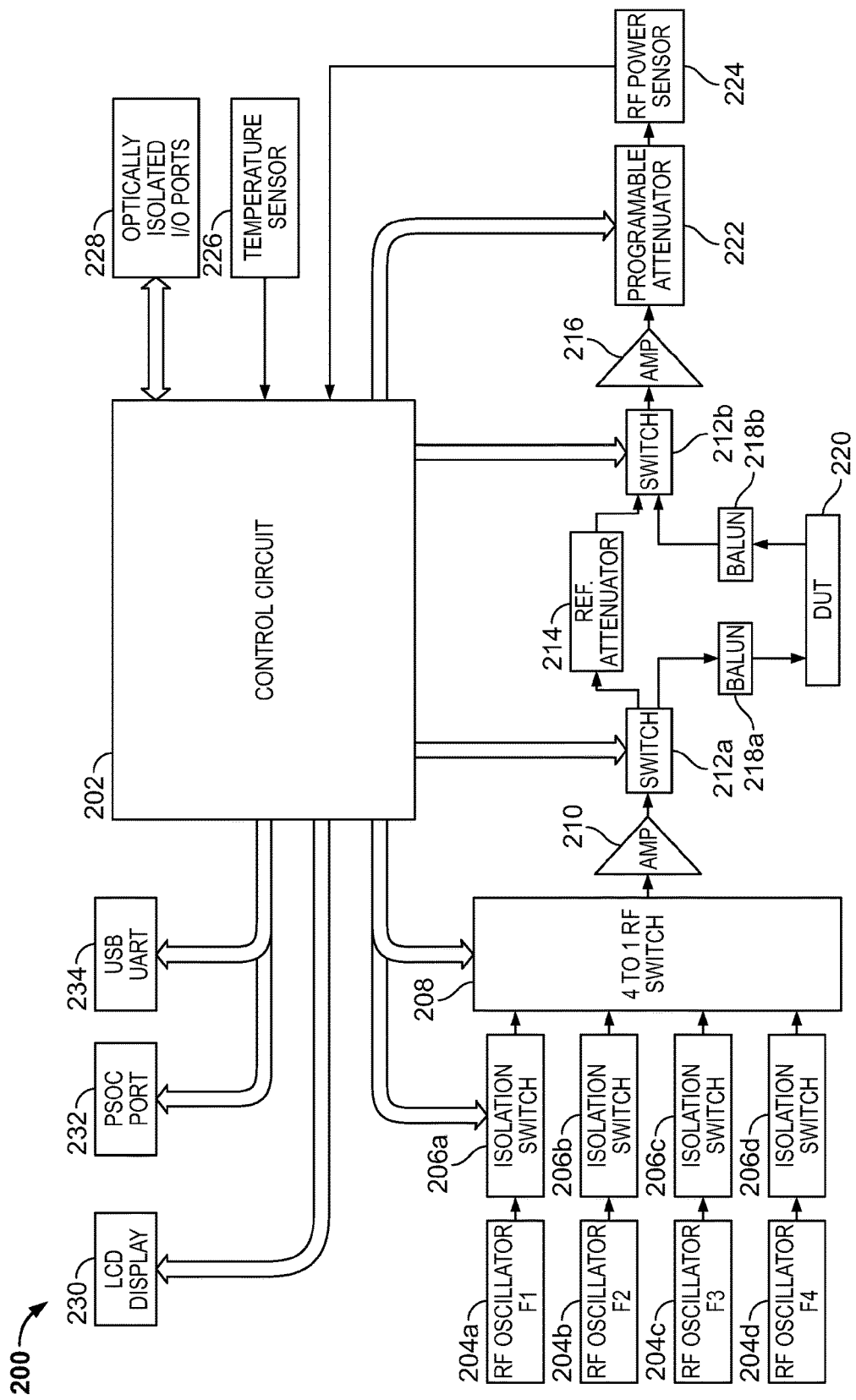
FIG. 2 is a block diagram of an automatic high frequency test station, according to an example embodiment.
Figure 3:
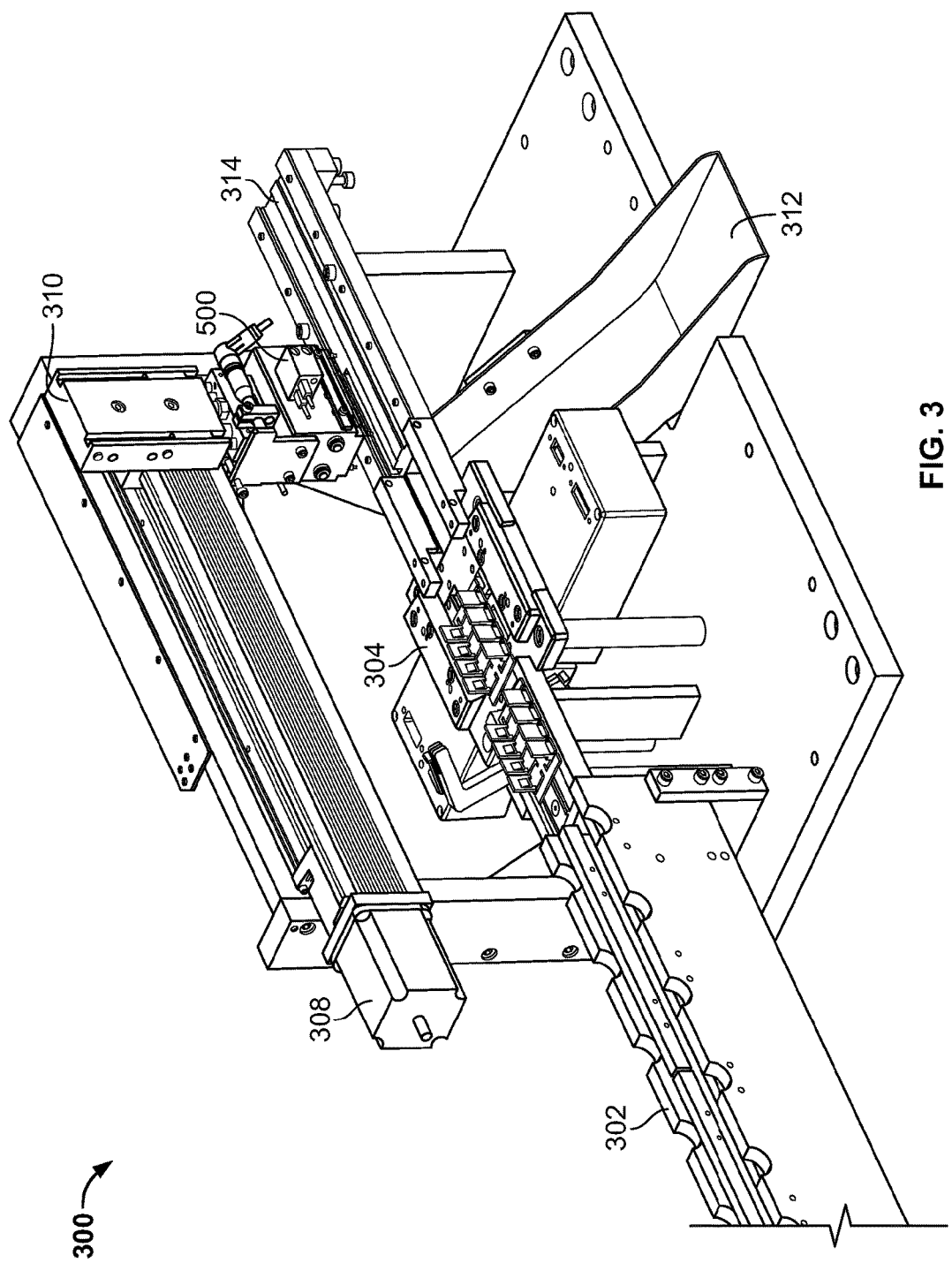
FIG. 3 illustrates a physical arrangement of an automatic high frequency test station as in FIG. 2.
Figure 4:
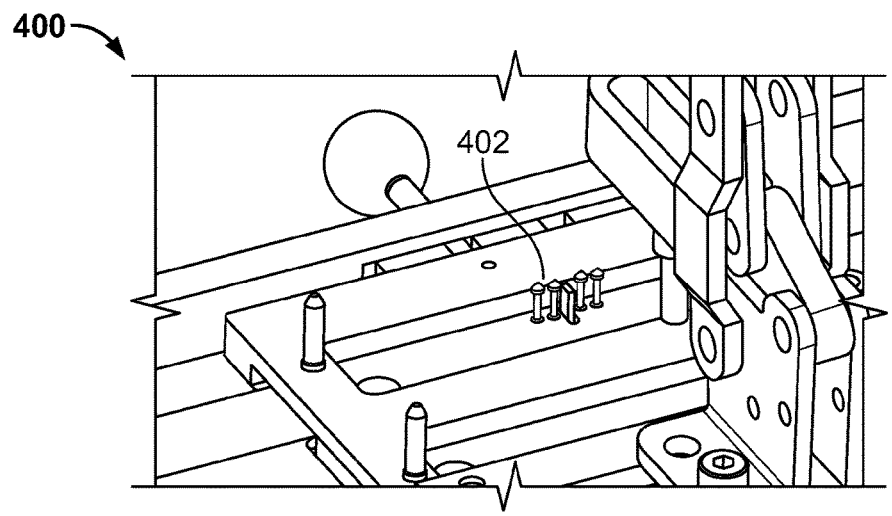
FIG. 4 illustrates spring probes included on a portion of the automatic high frequency test station of FIG. 3, useable to connect to an RJ-45 jack in an example embodiment.
Figure 5:
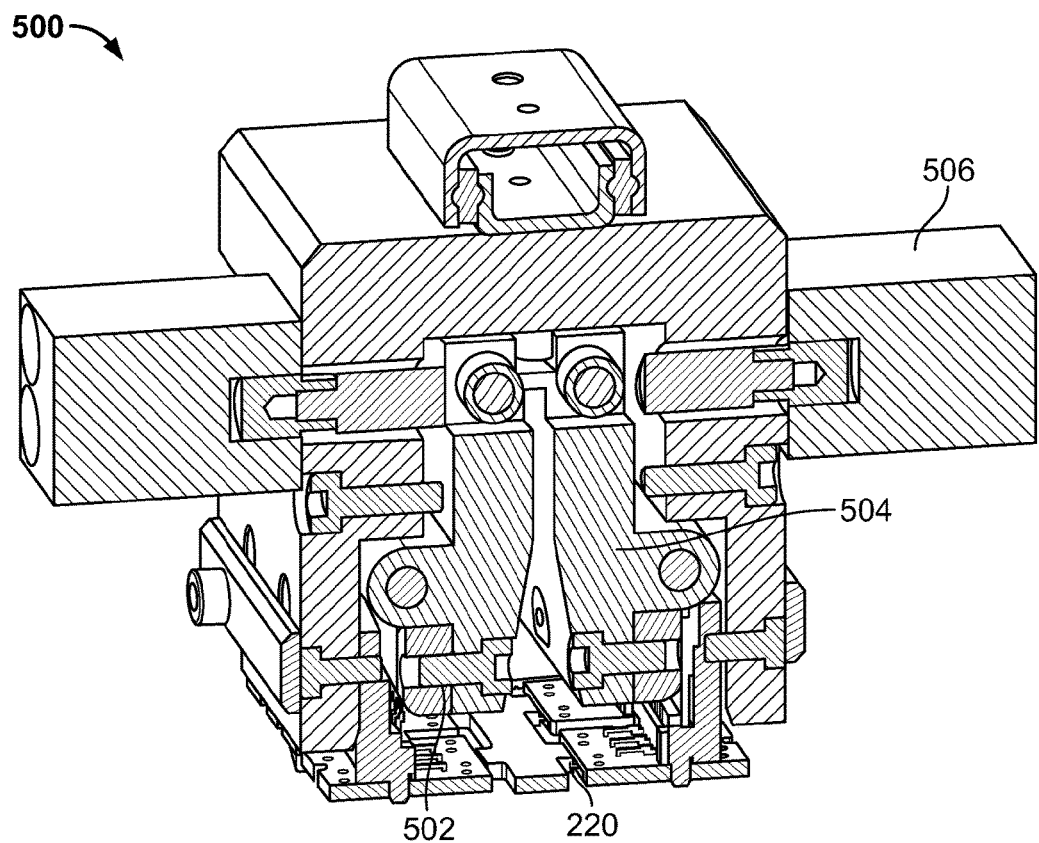
FIG. 5 illustrates construction of a gripper head included in the automatic high frequency test station of FIG. 3, according to an example embodiment.

As illustrated in FIG. 2, an example implementation of a test station 200 is shown. The test station 200 can be incorporated into an overall construction of an automatic high frequency test station, as illustrated in FIGS. 3-5.

In the embodiment shown, the test station includes a control circuit 202, which can be implemented as a microprocessor or other special purpose circuit. The control circuit 202 is configured to execute program instructions which, when executed, cause the test station 200 to perform an automated testing process of one or more designs under test, such as RJ-45 jacks, RJ-45 jack assemblies (including a plurality of such jacks), or subassemblies thereof.

In some embodiments, the control circuit 202 can be implemented using a special purpose microprocessor or system on a chip solution employing special-purpose instructions configured to execute the methods discussed herein. In alternative embodiments, the control circuit can be a general purpose processor executing instructions from memory. In further embodiments of the disclosure, control systems may be practiced in various types of electrical circuits comprising discrete electronic elements, packaged or integrated electronic chips containing logic gates, a circuit utilizing a microprocessor, or on a single chip containing electronic elements or microprocessors.

In the embodiment shown, the test station 200 includes a plurality of radio frequency (RF) oscillators 204*a-d*, each of which operates at a different frequency. In example embodiments, because NEXT behavior below 100 MHz is fairly linear, oscillators 204*a-d* are selected to operate at 100 MHz, 250 MHz, 500 MHz, and 1 GHz. Other test frequencies could be used as well. It is noted that each connector may be tested at two or more of such frequencies, including the frequency at which it is designed to operate as well as slower frequencies. For example, a category 6 jack would be tested at 500 MHz, but also tested at 250 MHz and 100 MHz as well.

In some embodiments, the RF oscillators 204*a-d* are embodied as voltage controlled oscillators, in which a fixed voltage is used to set each oscillator to an appropriate selected frequency. The set-frequency signals are passed through low-pass filters to minimize high-order harmonics that might be measured by the station 200, and which might distort test results.

In the embodiment shown, each RF oscillator 204a-d outputs a signal to a corresponding isolation switch 206a-d, which acts to selectively switch oscillators that are not being used to a termination resistor, or alternatively to pass the oscillator signal to an RF switch 208, which selects from among the set frequency inputs from the oscillators 204a-d for use in testing a design-under-test. By isolating the frequencies that are not currently used and terminating them to a resistor, interference that might otherwise be caused by limited isolation of the switch 208 is avoided.

From the RF switch 208, a selected signal is passed to an amplifier 210 to generate an amplified signal, useable as a test signal for testing power loss through a design under test at different frequencies. The amplified signal passes through a set of switches 212a-b, which selectively passes that signal, used as a test signal, through one of two possible paths, either through a reference attenuator 214 or a design-under-test 220. From switch 212b, an output signal is passed to an amplifier 216, programmable attenuator 222, and RF power sensor 224, the operation of each of which are discussed below.

In the embodiment shown, both the reference attenuator 214 and the design-under-test 220 are electrically connected between switches 212a-b, such that either could be selected to have a test signal applied thereto. Regarding the design-under-test 220, baluns 218a-b electrically translate a grounded signal to an ungrounded differential pair signal, for application to the design-under-test 220.

From the switch 212b, a resulting signal is amplified at the amplifier 216, and passed to a programmable attenuator. The programmable attenuator 222 can be, in some embodiments, configured as a step attenuator. The programmable attenuator 222 passes an attenuated signal to the RF power sensor 224, which translates a sensed power to a value that it communicates to the control circuit, which in turn assesses the pass/fail characteristic of the design under test.

As illustrated in FIG. 2, control circuit 202 includes a plurality of inputs and outputs to generally control operation of the test station 200, and to conduct testing on the design-under-test. For example, the control circuit includes outputs to switches 206a-d and switch 208 to select desired frequencies of test signals generated from oscillators 204a-d. Control circuit 202 also includes control signals routed to switches 212a-b, which selectively switch the path on which a test signal is routed, either to a reference attenuator 214 or through the design-under-test 220. Control circuit 202 also sets a programmed attenuation level of the programmable attenuator 222.

In addition to the above control outputs, the control circuit 202 includes a number of other input and output connections. For example, a temperature sensor 226 can provide to the control circuit a current temperature in the environment of the test station, which can affect interference levels. Additionally, a plurality of optically isolated I/O ports 228 allow for remote access to the control circuit, for purposes of control or review of records relating to testing (e.g., connection to an external PLC or control device). An LCD display 230 can also display a current status of the overall system, realtime measurements, or other features. A programming port 232 allows for direct reprogramming of the control circuit 202, and a USB interface 234 can also be included, for example to allow for communication with an external computing system, such as may be used for manual or laboratory testing, rather than manufacturing site bulk testing.

In operation, when a design-under-test 220 is placed in electrical connection with baluns 218a-b, the control circuit 202 will select one or more frequencies for testing, setting switches 206a-d and switch 208 accordingly. Initially, the control circuit 202 will set switches 212a-b such that the test signal received from amplifier 210 is passed through the reference attenuator 214. This signal is then measured by the power sensor 224, and used as a set reference for measurement. Switches 212a-b are then actuated to pass the test signal through the baluns 218a-b and design-under-test 220. It is noted that both reference and design-under-test signals are amplified by amplifier 216 and then attenuated by a programmable attenuator 222 to deliver signal strength that is set to optimize the accuracy of the power sensor 224. The NEXT of the design-under-test 220 is determined by a calculation of the relative strength of the reference signal path to the DUT measurement and the value of the programmable attenuator 222 that was needed to obtain the optimum signal level at the detector. A PASS/FAIL is determined by comparing the calculated NEXT of the design-under-test 220 against predefined limits.

Once this measurement is performed, the control circuit 202 may then elect to test the design-under-test 220 at a different frequency. As such, it would then actuate switches 206a-d, and switch 208. At each test frequency, a sine wave is switched between the two separate measurement paths, through the reference attenuator 214 and design-under-test 220 and measured with a power sensor 224. By re-testing against the known reference attenuator, there is a known attenuation, and the path through the design-under-test 220 is made relative to this known attenuation with the time between the measurements short enough to ensure that no significant temperature or other variation will have occurred. Thus, over a longer time period, the circuit self-compensates for temperature or other causes of measurement drift, since both the reference attenuator 214 and design-under-test 220 would be affected equally.

Referring now to FIG. 3, a physical arrangement of an automatic high frequency test station 300 is illustrated. The automatic high frequency test station 300 represents a large-scale testing apparatus that can be implemented using the circuitry of test station 200 of FIG. 2.

In the embodiment shown, the automatic high frequency test station 300 includes an upstream belt conveyor 302 configured to deliver designs under test (e.g., connectors or connector device subassemblies) to a test station 304. The test station 304 can, in some embodiments, represent a physical testing platform at which the circuitry described in connection with test station 200 of FIG. 2 is implemented.

In operation, designs under test 220, such as connector subassembly arrays, will be pushed from the upstream belt conveyor 302 of the automated assembly equipment to a stop position where its presence is detected via a photo electric sensor on the test station 304. A gripper head 500, discussed in further detail in connection with FIG. 5, below, is driven by a servo motor control 308 and mounted to a frame 310, picks up the design-under-test 220, and also maneuvers the design-under-test 220 into position using a servo motor control 308.

The design-under-test 220 is then indexed to a first test position and lowered onto the test station 304. In the embodiment shown, the test station 304 includes two testers operating in parallel, to achieve the desired cycle time for the overall system. Each tester will have 4 replaceable test probes 402 (seen in close-up view 400 of the test station 300, in FIG. 4) which electrically connect to relevant PCB holes of interest for testing. Connection of the design-under-test 220 to the tester 300 is achieved via the spring loaded test probes 402, which enable measurement paths through fixed attenuators and impedance matching baluns 218a-b connected via switches 212a-b and amplifiers 210, 216 to the transmission measuring ports. Optionally, for each test, the design-under-test 220 can be moved through a plurality of positions, or may remain in place. Furthermore, typically an overall set of tests for a particular design-under-test 220 will take approximately 1.5 seconds, in some embodiments. In alternative embodiments, other test periods could be used as well.

After all tests of the design-under-test 220 are completed, the design-under-test 220 is transferred to a reject/load position, above a reject chute 312. If the product failed any of the preceding tests, the gripper head 500 will release and lift, which will strip the design-under-test 220 from the head and cause it to be ejected down the reject chute 312. If the design-under-test 220 passed all the tests, it will be indexed onto an output track 314. The gripper head 500 will then release and lift away from the output track. By way of engaging the return edges on the top of the track with the design-under-test 220, the design-under-test 220 is stripped away from the gripper 500. The gripper head is designed with a magnetic breakaway system to protect the indexer in case of collision or downstream back up of product. The gripper head 500 will then index back ready to start the next cycle with a next subsequent design-under-test 220 on the upstream belt conveyor 302.

Referring now to FIG. 5, construction of a gripper head 500 included in the automatic high frequency test station 300 of FIG. 3 is shown, according to an example embodiment. In general, the gripper head includes a pair of clamp plates 502, which are insulated and pneumatically actuated and provide positioning and alignment to a design-under-test 220. Where the design-under-test 220 is a subassembly of an RJ-45 connector array (as shown in FIG. 5), gripper head 500 provides positioning and alignment of jack contacts simulating their actual position in the final jack assembly. Gripper head 500 also includes gripper clamps 504 that actuate the clamp plates 502, as well as a pneumatic actuator 506 actuating the gripper clamps 504, and which can be in turn actuated by an electronic control system (e.g., within the control circuit 202 or some external control system).

Figure 6:
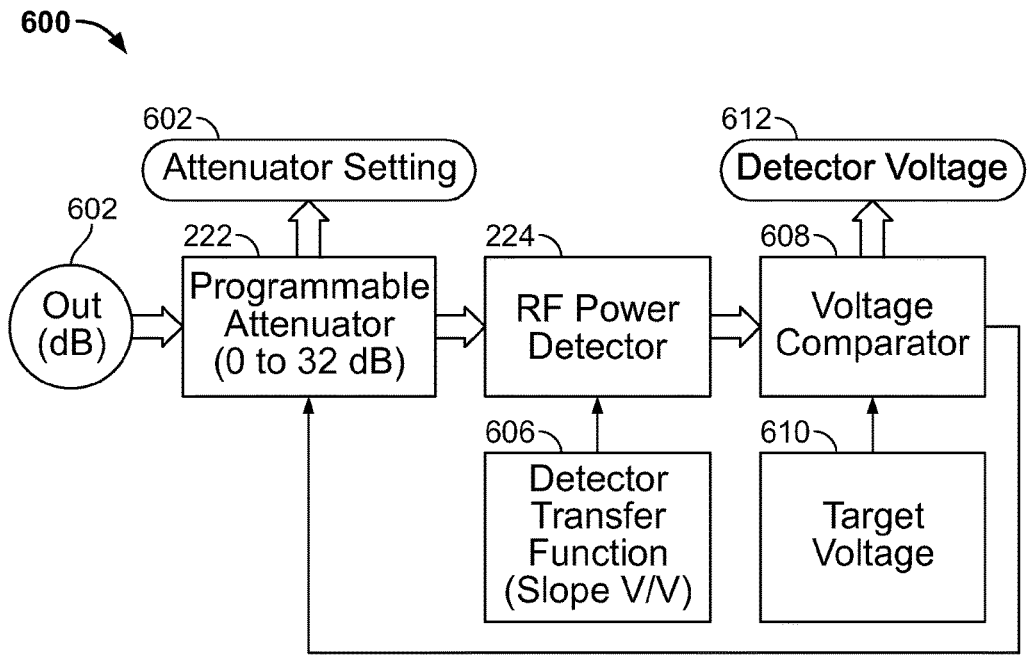
FIG. 6 is a block diagram of a control system for adjusting a variable attenuator to change output power at the detector, and as included in the automatic high frequency test station.

FIG. 6 is a block diagram of a control system 600 for adjusting a variable attenuator to change output power at the detector, and as included in the automatic high frequency test station. In example embodiments, the control system 600 can be implemented using the control circuit 202, programmable attenuator 222, and RF power detector 224 of FIG. 2.

Generally, and by way of background, the testing measurement process performed by the test station 200 works by making two measurements and combining the results algebraically to determine the NEXT of the design-under-test 220. To that end, a first measurement (block 602) of a known reference attenuator 214 is used. For each measurement, the RF signal level received at the detector is adjusted by an electronic variable attenuator (e.g., programmable attenuator 222), and compared at a voltage comparator 608 until the detected voltage is less than a predetermined value (e.g., target voltage 610) that is chosen to optimize the detector accuracy. At this point, an electronic attenuator setting 602 and the measured detector voltage 612 are recorded. This comparison is performed by using a detector transfer function 606 as an input control to the power detector 224, as well as a target voltage 610 as stored in the control circuit 202 and provided to voltage comparator 608.

During reference path measurement, the source input power to the circuit is calculated by measuring the power received at the detector and recording the attenuation of the fixed attenuator (reference attenuator 214) and variable attenuator (programmable attenuator 222) using the following equation:

$$P_{input}=P_{output}+Atten_{fixed}+Atten_{variable}$$

In this equation, $P_{input}$ corresponds to the power delivered by amplifier 210, while $P_{output}$ corresponds to the power output detected at the power detector 224. When switching to the path including the design-under-test 220, the amount of loss through the path that includes design-under-test 220 is then measured and the power received at the detector along with the value of the variable attenuator is recorded. The NEXT of the design-under-test 220 can then be calculated using the following equation:

$$NEXT_{DUT}=P_{output}-P_{input}+Atten_{variable}$$

The NEXT of the design-under-test 220 is then compared to predetermined limits regarding an amount of acceptable NEXT to determine whether the particular design-under-test 220 meets pass/fail criteria.

In general, and as illustrated in further detail in connection with FIGS. 7-9, in some cases it is possible to reliably determine whether an electrical connector, such as an RJ-45 connector, will pass or fail relative to an upper and lower bound on acceptable NEXT levels based on determined NEXT levels measured for subcomponents of the connector down to the bare circuit board level. To determine the predetermined NEXT limits for a component subassembly or other design-under-test, a test laboratory condition can be used to measure NEXT of a finished jack. In particular, a finished jack is first measured in accordance with the appropriate test method for the product. For example, a finished jack can be tested for NEXT based on a typical plug-jack combination. The jack is then modified by tuning the compensation circuit to a maximum NEXT condition under which the appropriate test limit is met (e.g., the upper boundary of acceptable vs. unacceptable NEXT). The modified jack is then disassembled to the same level of assembly that will be tested in manufacturing. It is then measured on the production test setup and the measured NEXT of the jack subassembly is compared to the reference circuit in the tester as outlined in the measurement process. This sets the upper limit for the pass/fail criteria. The same procedure is then used by tuning a jack to the minimum NEXT condition for meeting the test limit to determine the lower test limit.

The criteria used for the test limit can be chosen as appropriate for the product line. If full compliance to particular component standards is required, then the jacks are tuned such that component compliance is achieved and the pass/fail criteria ensure this level of performance. If "system" compliance is required, the jack may be tuned to a different level of component performance that is required to ensure the system level performance. The pass/fail criteria can then ensure that an installed system will always pass system requirements. This procedure is repeated for each category of product that is to be tested and at each frequency that is required for that category. The category to be tested is set on the tester or in software at the test station.

Figure 7:
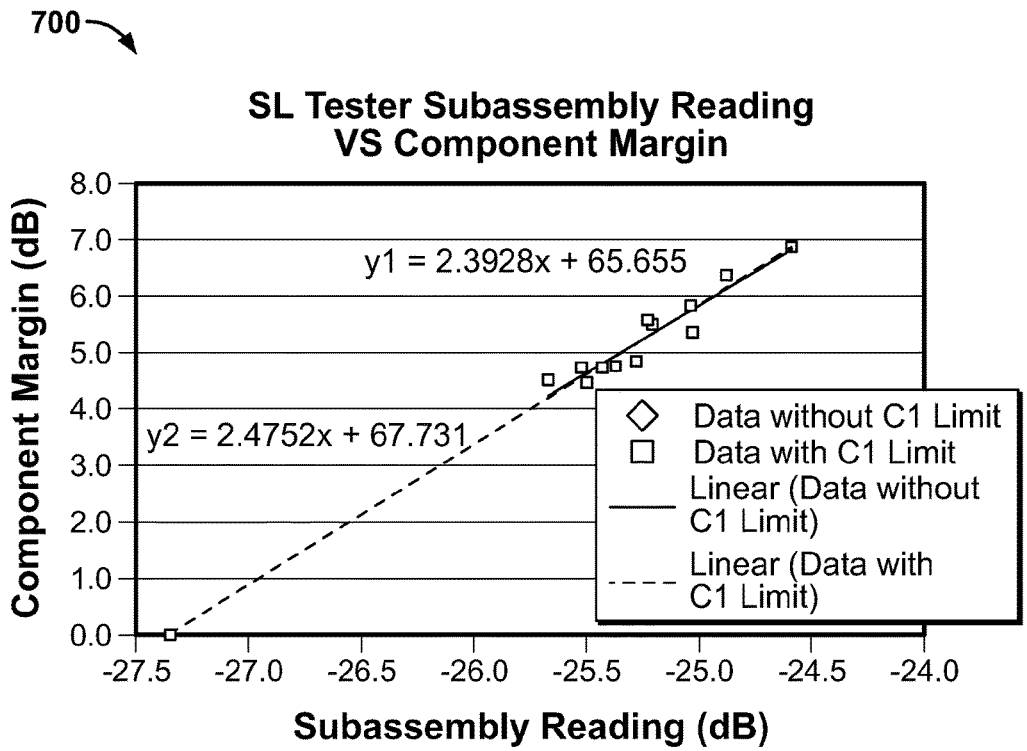
FIG. 7 is a chart illustrating a correlation between test results of a connector subassembly and finished product performance of an RJ-45 jack.

To further illustrate the correlation between testing of a subassembly and a finished RJ-45 jack, FIG. 7 is a chart 700 illustrating a correlation between test results of a connector subassembly and finished product performance of an RJ-45 jack. The chart 700 illustrates a sampling of performance of end products relative to tested subassemblies to illustrate the effectiveness of testing jack subassemblies. As seen in FIG. 7, twelve samples were measured with the test system after the limits were established, and then the finished product was assembled into jacks and tested to component compliance in the test laboratory. Using the correlation obtained by comparing the results, it is possible to predict the headroom of the finished product to the specifications based on the measurement of the subassembly using the production tester. The correlation of the data to a linear fit was calculated at 95%, demonstrating good correlation between the results and validating the assumptions that the system can test in an open circuit condition ignoring the inductive coupling effects.

Figure 8:
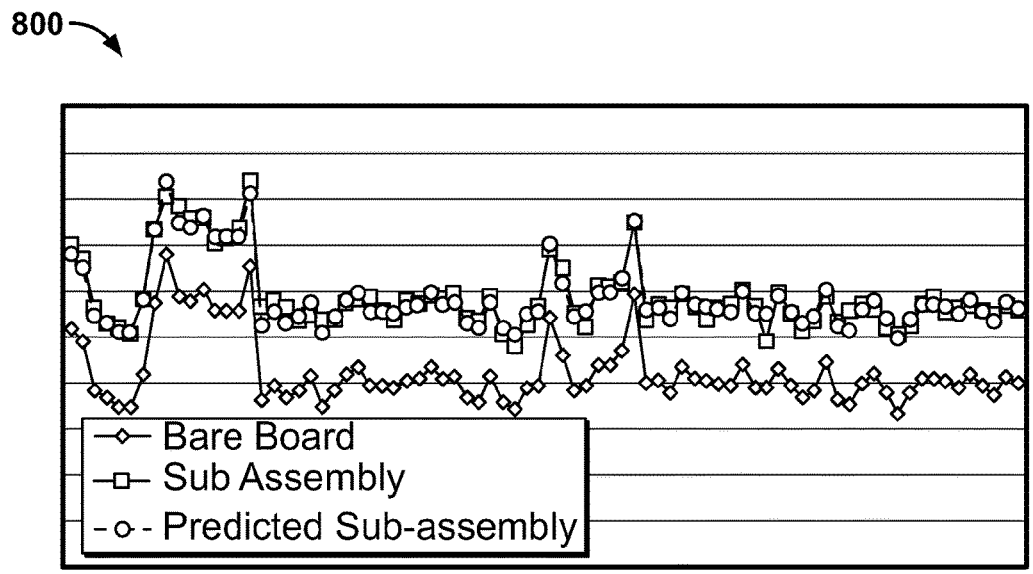
FIG. 8 is a chart illustrating a correlation between near end crosstalk of a bare circuit board included in an RJ-45 jack and near end crosstalk of a subassembly of an RJ-45 jack.

Referring now to FIG. 8, a chart 800 is shown illustrating a correlation between near end crosstalk of a bare circuit board included in an RJ-45 jack and near end crosstalk of a subassembly of an RJ-45 jack. Chart 800 specifically illustrates results of further testing performed by measuring a bare printed circuit before assembly as representing the design-under-test. Specifically, the data represented in chart 800 represents ten printed circuit boards, each containing eight separate circuits are included and measured for a total of 80 measurements. Such printed circuit boards were then assembled into subassemblies of corresponding RJ-45 jacks, and measured on the test station 200 of FIG. 2, above.

The subassemblies were then assembled and measured on the automated tester and a correlation was again determined. A strong correlation was found to exist between the bare PCB and the subassembly manufactured from those circuit boards. As seen in the chart 800, a strong correlation is apparent between the bare board measurement and that of the sub assembly, such that based on the NEXT measurements of the bare board, the NEXT of the sub-assembly can easily be predicted with a high correlation.

Figure 9:
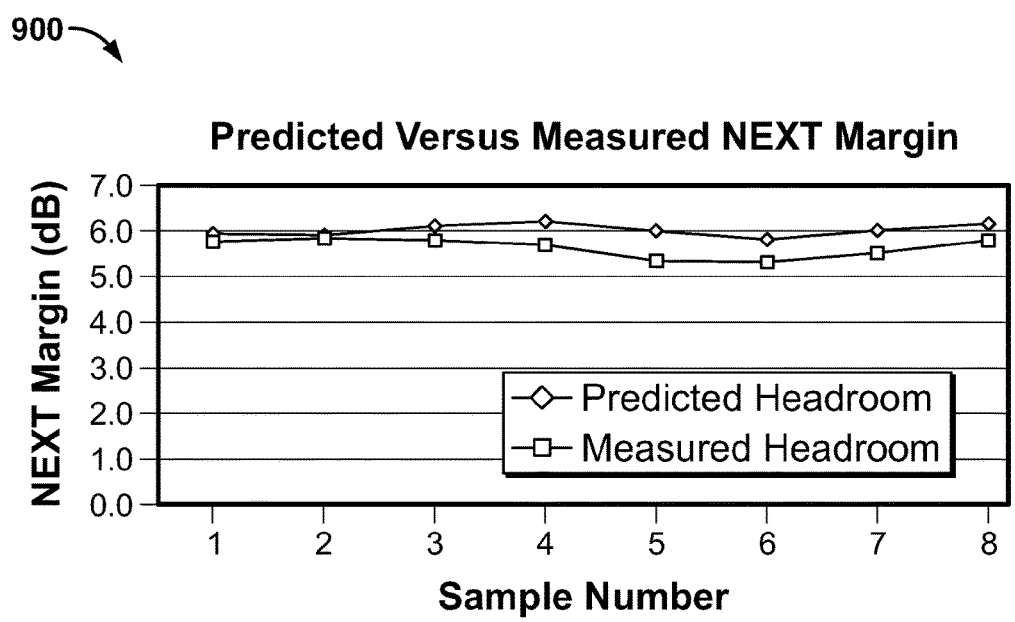
FIG. 9 is a chart illustrating a comparison between predicted and measured near end crosstalk margin across a number of samples, as tested for Category 5e performance, by way of example.

As seen in FIG. 9, a chart 900 shows a comparison between predicted and measured near end crosstalk margin across a number of samples, as tested for Category 5e performance, by way of example. In the experiment resulting in the data points as illustrated on chart 900, eight of the subassembly samples discussed above were fully assembled and measured in a test laboratory. Based on the correlation of the bare boards to the subassemblies as illustrated in chart 800 FIG. 8, and the subassemblies to the finished product as illustrated in the chart 700 of FIG. 7, the finished jack headroom was predicted to a great extent based on the bare board measurements alone (seen in the slight deviation between predicted and measured headroom).

Accordingly, as seen in these measurements for a category 5e jack, it is seen that it is possible to test at a bare board level to assure NEXT performance in the ultimate product to be manufactured (i.e., a jack). Referring generally to FIGS. 1-9, it is noted that the primary variability in manufacture of a jack is determined by variability in manufacture of the circuit board, and therefore testing at the bare circuit board or subassembly level provides a reliable indication of the likelihood of a pass/fail determination relating to the connector overall. Furthermore, because category 6 and 6A telecommunications jack often have two circuit boards, such jacks would typically be tested at the subassembly level to assure product performance, rather than testing a single board. However, since most of the capacitive compensation is on one of the two boards, it may be possible to predict performance for those at a bare board level as well.

In connection with the present disclosure, a repeatability and reproducibility study was performed on the test station 200 as discussed above with respect to FIG. 2. In that study, twelve subassemblies (package of eight on each) were randomly collected during a three week period from a production floor. All twelve subassemblies were measured by the tester. Twelve individual samples, one from each subassembly, were selected with a wide range of variation of reading and position. Twelve samples were measured with a random sequence by a first operator, followed by another random sequence measurement performed by a second operator. This test sequence was repeated for total of four measurements per sample. The results of the study are summarized in Table 1, below.

TABLE 1

Repeatability and Reproducibility Study

| | % Repeatability and Reproducibility | % Study | % P/T | Distinct Categories |
|---|---|---|---|---|
| Ideal Result | <2% | <14% | <8% | >10 |
| Actual Result | 1.19% | 10.89% | 4.78% | 12 |

As seen in Table 1, the tester demonstrates repeatability and reproducibility results within an expected and desired success rate.

Referring to FIGS. 1-9 generally, it is noted that the automatic high frequency test station of the present disclosure provides a mechanism that not only can be used to test every component that is manufactured (rather than on an audited, or sampled, basis), but that can test subassembly or circuit board portions of an overall connector as a design-under-test, and can use that measurement to determine whether a connector containing that subassembly or circuit board will ultimately fail a NEXT calculation. The test station of the present disclosure also allows for testing each component at a plurality of frequencies to quickly and conveniently perform NEXT measurements at multiple frequencies. The test station does not require loads to be applied to a test circuit, and does not require as much amplification, since the test circuitry surrounding a design-under-test is simplified.

The above specification, examples and data provide a complete description of the manufacture and use of the composition of the invention. Since many embodiments of the invention can be made without departing from the spirit and scope of the invention, the invention resides in the claims hereinafter appended.

The invention claimed is:
1. A test station comprising:
a test platform including a plurality of probes configured for electrical connection to a design under test;
a radio frequency switch configured to receive at least first and second signals at first and second frequencies, the first and second frequencies being different from each other;
an amplifier positioned and electrically connected to one or more of the plurality of probes, the amplifier configured to receive the selected signal from the radio frequency switch and output a test signal, the test signal corresponding to an amplified selected signal;
a second amplifier positioned and electrically connected to one or more of the plurality of probes, the second amplifier configured to receive a result signal passed through the design under test;
a programmable attenuator connected to an output of the second amplifier and having configurable attenuation levels;
a power sensor electrically connected to receive a scaled result signal from the programmable attenuator based on the result signal and generate a sensed power output signal;

a control circuit communicatively connected to the radio frequency switch, amplifier, second amplifier, and power sensor, the control circuit configured to execute instructions to selectively apply the first and second frequencies as the test signal to the one or more of the plurality of probes, thereby applying a test signal at each of the first and second frequencies to the design under test, wherein the design under test comprises an electrical connector subassembly, the control circuit further configured to determine the existence of a faulty product incorporating the design under test based on the sensed power output signal.

2. The test station of claim 1, further comprising a plurality of oscillators including at least a first oscillator operating at the first frequency and a second oscillator operating at the second frequency.

3. The test station of claim 1, further comprising a programmable attenuator receiving the amplified result signal and outputting an attenuated amplified result signal provided to the power sensor.

4. The test station of claim 1, further comprising a plurality of isolation switches, each isolation switch electrically connected between one of the plurality of oscillators and the radio frequency switch, each isolation switch providing selective switching between termination of the corresponding one of the plurality of oscillators to a termination resistor and connection to the radio frequency switch.

5. The test station of claim 1, wherein the tester further includes a display communicatively connected to the control circuit.

6. The test station of claim 1, wherein the control circuit comprises a microprocessor.

7. The test station of claim 1, further comprising first and second switches configured to selectively deliver the test signal to at least some of the plurality of probes, thereby providing the test signal to the design under test.

8. The test station of claim 1, further comprising a reference attenuator positioned between the first and second switches.

9. The test station of claim 1, wherein the design under test comprises a subassembly of an RJ-45 jack.

10. The test station of claim 1, wherein the first frequency is 250 MHz, and the second frequency is 500 MHz.

11. The test station of claim 1, wherein the control circuit detects the existence of a faulty design under test by computing near end crosstalk generated by the design under test at each of the first and second frequencies.

12. The test station of claim 1, further comprising:
an in-feed conveyor delivering a plurality of electrical connector subassemblies to the test station; and
a gripper head configured to sequentially deliver electrical connector subassemblies onto the plurality of probes for testing, each electrical connector subassembly representing the design under test when positioned on the plurality of probes.

13. The test station of claim 1, further comprising a reject chute positioned to receive faulty electrical connector subassemblies as determined by the control circuit.

14. The test station of claim 1, further including one or more baluns electrically delivering the test signal to and receiving the result signal from to the plurality of probes electrically connected to the design under test.

15. The test station of claim 1, further comprising a temperature sensor connected to the control circuit and useable to compensate the result signal based on a current temperature.

16. The test station of claim 1, further comprising a plurality of communication ports electrically connected to the control circuit.

* * * * *